March 10, 1970 C. R. HINTZ ET AL 3,499,220

METHOD OF AND APPARATUS FOR MAKING A FLEXIBLE, PRINTED ELECTRICAL CIRCUIT

Filed Feb. 28, 1967 4 Sheets-Sheet 1

INVENTORS
CARMAN R. HINTZ
WILLIAM A. SEABURY
BY
Samuelson & Jacob
ATTORNEYS

INVENTORS
CARMAN R. HINTZ
WILLIAM A. SEABURY
BY
Samuelson & Jacob
ATTORNEYS

INVENTORS
CARMAN R. HINTZ
WILLIAM A. SEABURY
BY
Samuelson & Jacob
ATTORNEYS

INVENTORS
CARMAN R. HINTZ
WILLIAM A. SEABURY
BY
Samuelson & Jacob
ATTORNEYS

United States Patent Office 3,499,220
Patented Mar. 10, 1970

3,499,220
METHOD OF AND APPARATUS FOR MAKING A FLEXIBLE, PRINTED ELECTRICAL CIRCUIT
Carman R. Hintz, Deal, N.J., and William A. Seabury, Ulster Park, N.Y., assignors, by mesne assignments, to Amerace Esna Corporation, New York, N.Y., a corporation of Delaware
Filed Feb. 28, 1967, Ser. No. 619,260
Int. Cl. H05k 3/30
U.S. Cl. 29—626 8 Claims

ABSTRACT OF THE DISCLOSURE

A method of making a flexible, printed electrical circuit including bonding a metallic sheet to a flexible polyimide, stable at temperatures of the order of 700° F., applying an etch resistant material to selected, desired portions of the metallic sheet, etching away the undesired portions of the metallic sheet to form a metallic circuit of the remainder of the metallic sheet, applying solder resistant material to selected portions of the metallic circuit, inserting electrical components in predetermined locations in the metallic circuit, holding the combination in a flexible mold and rotating it through a bath of hot solder such that the leads of the electrical components are soldered to the circuit and the selected portions of the metallic circuit are free of solder.

Apparatus for carrying out the method including a curved, flexible mold, formed to receive the electrical components, mounted on a rotating fixture above a solder batch such that the electrical components are soldered to the metallic printed circuit as the combination passes through the solder bath.

The invention relates to a method of making a flexible printed electrical circuit with a header or header and adapter so that the circuit may be folded into an enclosure and the header may form one face of the enclosure. The invention is also directed toward providing apparatus for carrying out the method.

More particularly, the invention is directed toward providing a flexible, printed electrical circuit which may be folded into an enclosure and which may be manufactured by dip, wave or continuous, pass-through soldering.

It is an important object of the invention to provide a method of making a flexible, printed electrical circuit having a flexible base which is stable at temperatures of the order of 700° F.

It is a further object of the invention to provide such a flexible, printed electrical circuit which may be dip, wave or pass-through soldered.

It is a still further object of the invention to provide such a flexible, printed electrical circuit wherein solder does not adhere to any metallic areas which are not used to make contact with an electrical component or the leads thereof.

It is a still further object of the invention to provide a fixture to facilitate the holding and soldering of electrical components to the desired points of contact of the flexible, printed electrical circuit.

It is a still further object of the invention to provide a flexible mold having recesses to receive the electrical components and means to affix the flexible, printed electrical circuit thereto. The flexible mold is insertable in and removable from the soldering fixture to expedite production of finished, flexible, printed electrical circuits of the invention.

It is a still further object of this invention to provide in one fixture means for positioning and holding the flexible, printed electrical circuit so as to provide a feasible means of preparing (fluxing) and finishing (cleaning and trimming) all the affixed electrical components and the flexible, printed electrical circuit without having to remove them from the fixture.

These and other objects, advantages, features and uses of the invention will be apparent during the course of the following description, when taken in conjunction with the accompanying drawings, wherein.

Figure 1:
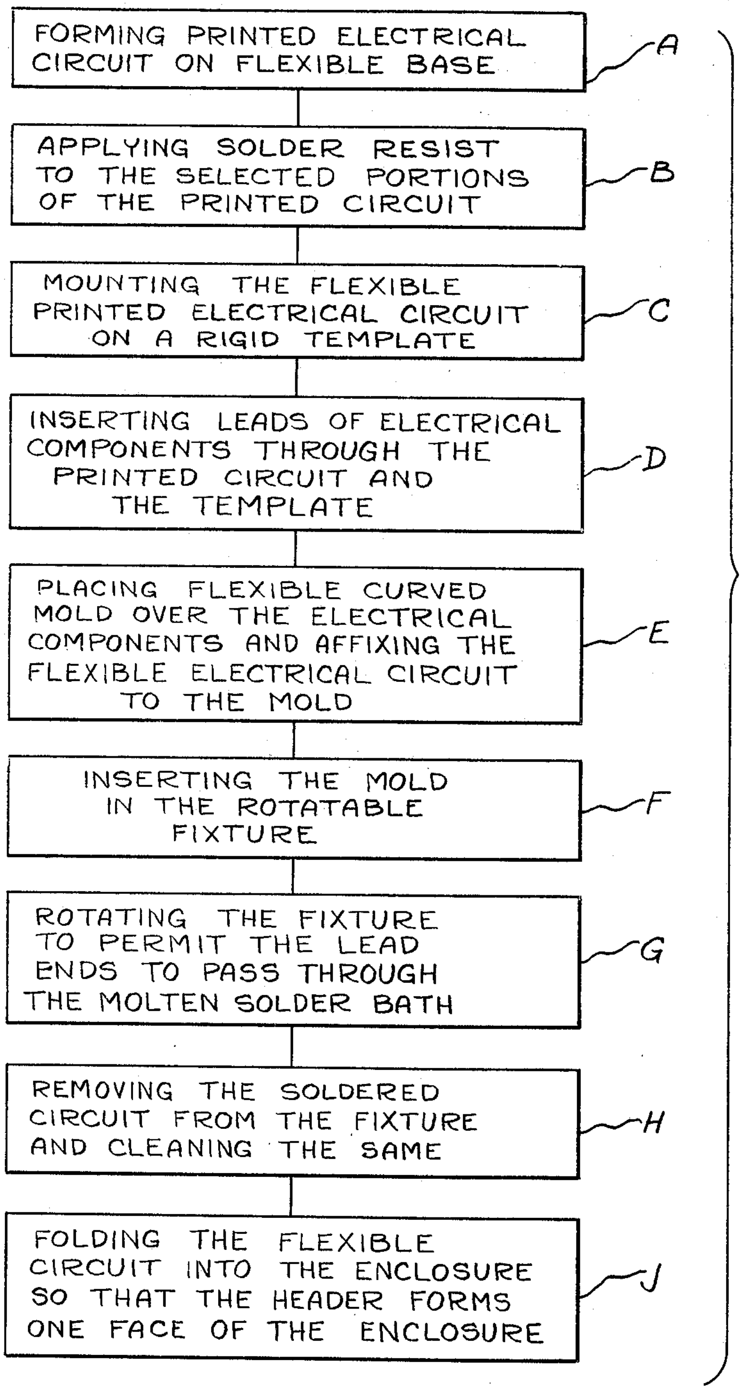
FIGURE 1 is a flow diagram illustrating the steps of the method of the invention.

FIGURE 1 serves to illustrate the steps of the method of the invention. First (Step A), the printed electrical circuit is applied by bonding a thin sheet of metal such as copper to a flexible sheet of polyimide or similar material which is stable at temperatures of the order of 700° F. One such polyimide is manufactured by Du Pont under the trademark Kapton. It is important that the base material be stable at high temperatures to permit the assembly to be dip, wave or pass-through soldered.

After the metal sheet has been bonded to the polyimide, an etch resistant material which is well known in the art, such as a medium body asphalt base having the desired circuit configuration, is applied to the metal sheet by photographic process, printing or any other method which is well known in the printed circuit art. Now an etching acid such as iron perchloride is applied so that those portions of the metal sheet which were not covered by the etch resistant material are removed, leaving a metallic circuit bonded to the polyimide base. The etching acid is now washed off by immersing the strip in trichlorethylene. Openings or holes to receive the lead ends of the electrical components to be connected in the circuit are now provided in the strip by drilling, punching or similar techniques.

Figures 2, 3, 4:
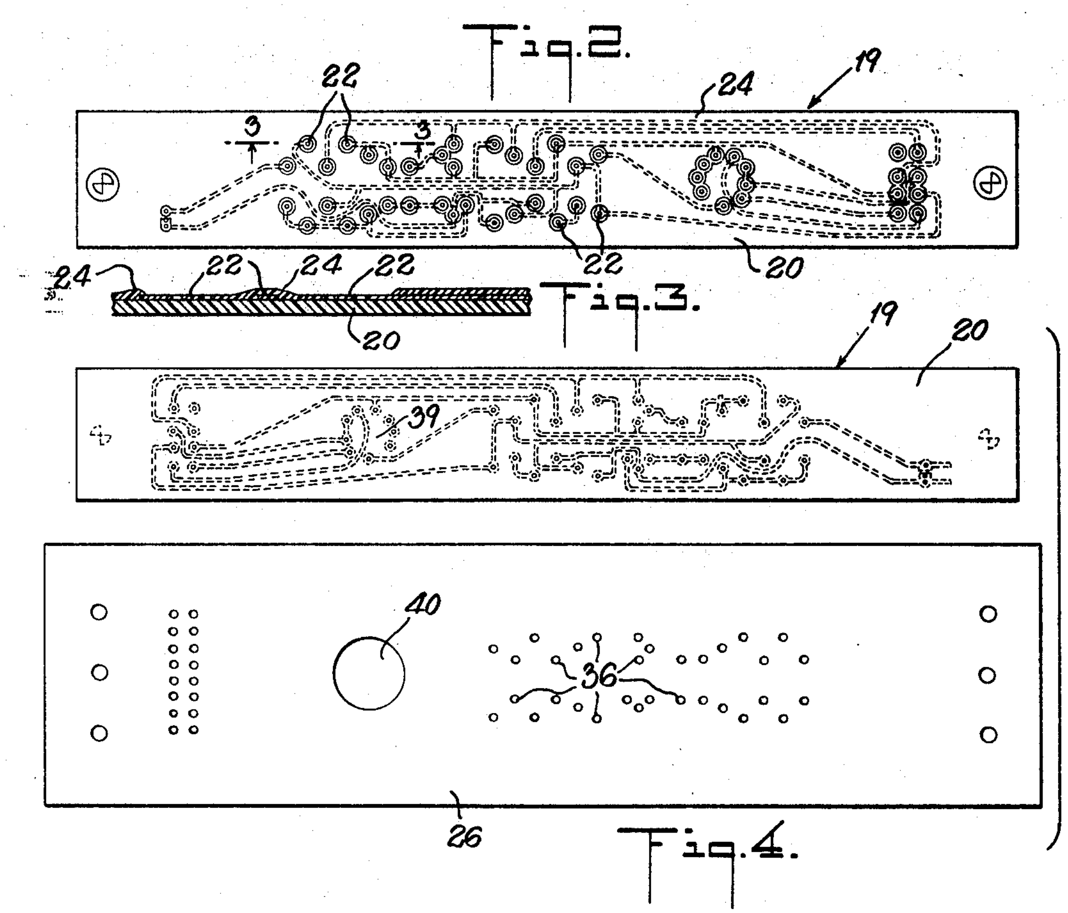
FIGURE 2 is a plan view of a flexible, printed electrical circuit showing solder resistant material applied to those areas which are to be left free of solder.
FIGURE 3 is an enlarged sectional view taken along the lines 3—3 of FIGURE 2, viewed in the direction of the arrows.
FIGURE 4 is a plan view of the flexible strip of FIGURE 2 and of the rigid template used in conjunction therewith to carry out the teachings of the invention.

Next (Step B), a solder resistant material such as Lonco Solder Resist PC33R is applied to those portions of the metallic circuit which are to be left free of solder. In FIGURES 2 and 3, solder resistant material 24 is seen to be applied over the metal 22 which is to be free of solder. The portions of the metal 22, which are to be soldered, are not covered by the solder resistant material 24. Metal 22 remains bonded throughout the circuit configuration to flexible polyimide base 20.

FIGURE 4 illustrates the opposite side of flexible circuit 19 from that shown in FIGURE 2. It is shown prior to being placed on rigid template 26. The strip 19 is placed on template 26 in register as required by the circuit configuration desired and is held in position, for example, by tape strips 28 (FIGURE 5) or similar means (Step C).

Figures 5, 6:
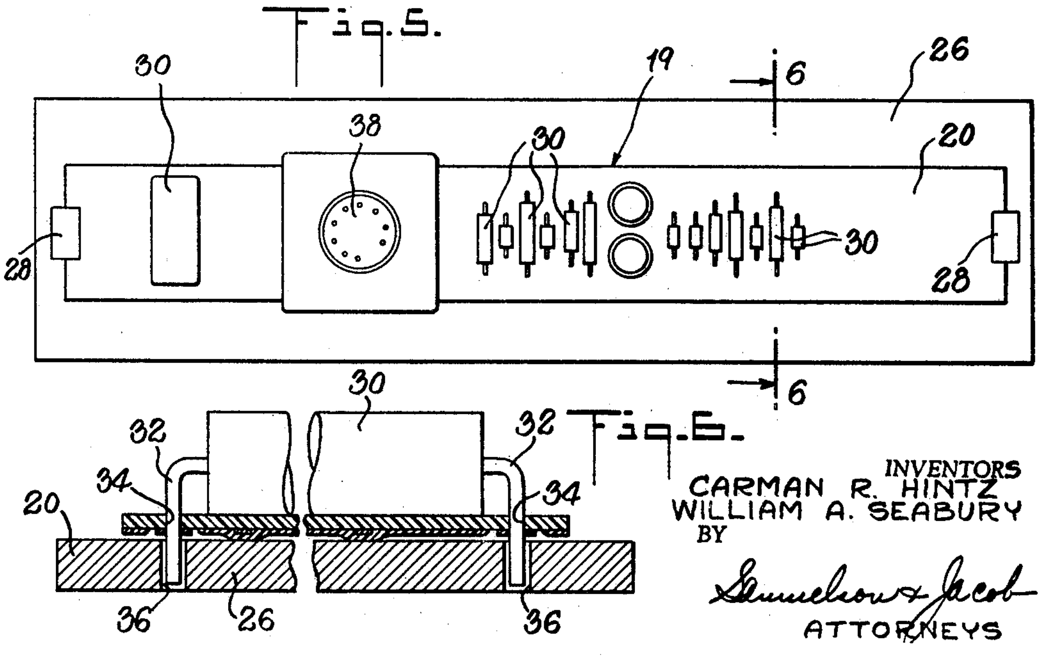
FIGURE 5 is a plan view showing the flexible strip overlaying the rigid template and with the electrical components inserted in the flexible strip and the template.
FIGURE 6 is an enlarged sectional view taken on the lines 6—6 of FIGURE 5, viewed in the direction of the arrows.

Next (Step D), the lead ends 32 of electrical components 30 are inserted through matching holes 34 and 36 which are respectively located in the flexible strip and the rigid template (FIGURE 6). It should also be noted that header 38 is also inserted in the matched spaces 39 and 40 provided in flexible strip 20 and template 26 (FIGURE 4).

Figure 7:
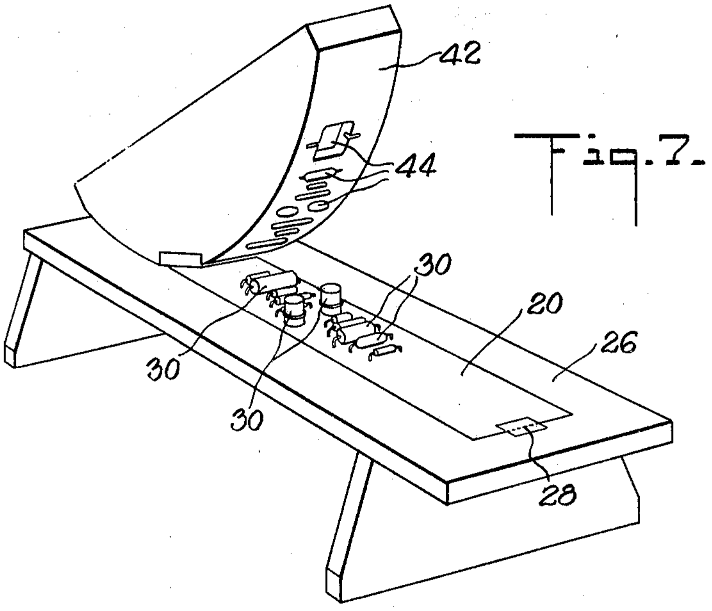
FIGURE 7 is a perspective view showing the curved, flexible mold, which has recesses to receive the electrical components, being applied to the strip of FIGURE 6.

Step E is illustrated in FIGURE 7. Curved, flexible mold 42 which is provided with an arcuate surface having recesses 44 to receive each of the components 30 is rolled over strip 20 which is removed from template 26 and affixed to the mold 42. Strip 20 is held to the surface of mold 42 by means of the snug fit of the components in the cooperating recesses. Then, preferably, the ends of the flexible base are folded over the edges of the curved portion of curved, flexible mold 42 and are clamped to the sides of the mold by means of spring clamps or similar devices (details not shown). Alternatively, slots may be provided in the mold to receive the ends of the flexible base.

Figure 8:
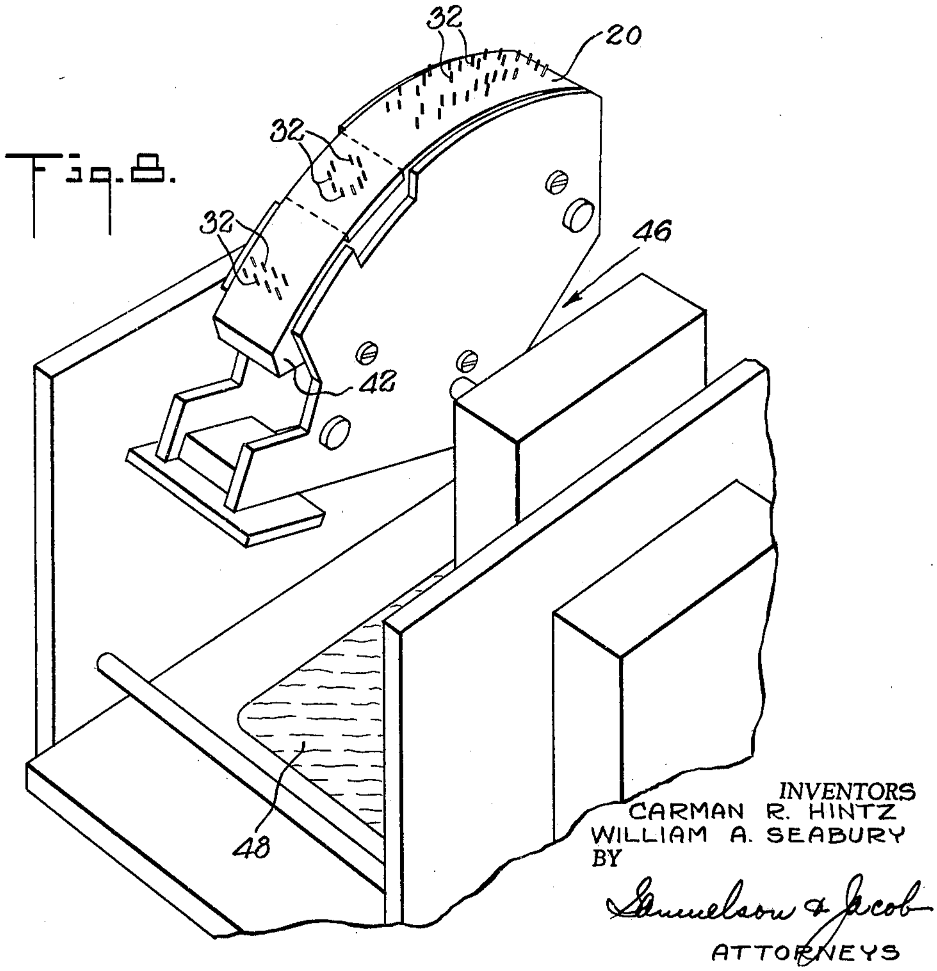
FIGURE 8 is a perspective view showing the curved, flexible mold, with the flexible strip affixed thereto, mounted in the rotatable, soldering fixture.

In Step F, flexible mold 42 with strip 20 held thereto is placed in rotatable fixture 46 (FIGURE 8). Flexible mold 42 is held in position by means of snap clamps (not shown). When the flexible mold 42 is in position in the rotatable fixture 46, the lead ends of the components and the portions of the circuit to be soldered are prepared for soldering (flux is applied as required). If desired, the flux may be applied by rotating the assembly through a flux bath in the same manner as is described below in connection with step G. Rotatable fixture 46 is placed with the lead ends 32 projecting outwardly so that they will pass through the molten solder bath 48.

Figures 9, 10, 11, 12, 13:
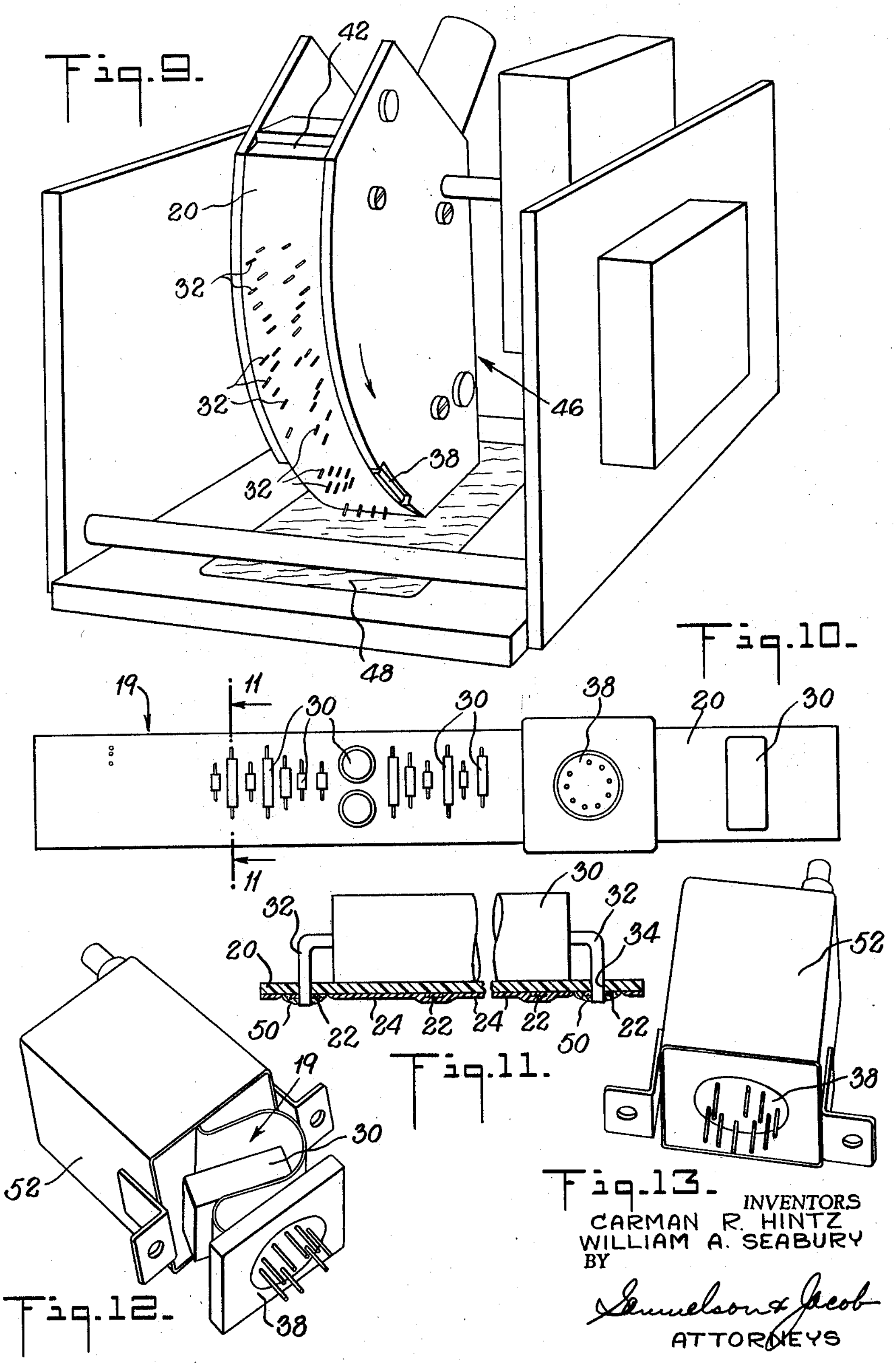
FIGURE 9 is a perspective view of the rotatable, soldering fixture showing the position of the curved, flexible mold, with the flexible strip affixed thereto, at substantially the end of the soldering process.
FIGURE 10 is a plan view of a flexible, printed electrical circuit after the electrical components have been soldered to the metallic circuit of the strip.
FIGURE 11 is an enlarged sectional view taken on the lines 11—11 of FIGURE 10, viewed in the direction of the arrows.
FIGURE 12 is a perspective view showing the flexible, printed electrical circuit being inserted in an enclosure or casing.
FIGURE 13 is a perspective view of an enclosed, flexible, printed electrical circuit in which the header which was soldered to the flexible, printed electrical circuit serves as one face of the casing or enclosure.

FIGURE 9 (Step G) shows the fixture in a position wherein the fixture is at the end of a rotation cycle and the lead ends 32 having passed through the molten solder bath so that they have been soldered to the metallic circuit on the flexible strip. The lead ends of the components are then trimmed so that they do not project from the flexible strip any more than is necessary to maintain good connections.

The molten solder bath may be of any composition which has been found useful in the art. Moreover, the velocity of the fixture will affect the quality of the finished circuit. If the velocity is too high, the molten solder bath will splash. This will also occur if the bath is too hot. If the velocity is too low, the heat transfer will damage the components. If the bath is too cold, the solder joints will be poor.

The transit time of the circuit through the solder bath is a function of: (1) the size of the component leads; (2) the temperature of the bath; (3) the type of solder; (4) the type of component leads; and (5) the geometrical pattern of the component leads. By way of example, but without limitation of the scope of the invention, we have found that when using a bath comprised of 60% tin and 40% lead at a temperature of 530° F., we have produced excellent soldered joints if each joint remains in the bath for a dwell time of less than one second.

Step H comprises removing the soldered circuit from the fixture and the mold and cleaning it with perchlorethylene. FIGURES 10 and 11 show the soldered circuit after Step H. Lead ends 32 are seen to be soldered to metal 22 by means of solder 50 and the metal 22 which was covered by the solder resistant material 24 is free of solder. This makes the finished articles much more flexible than those in which solder is affixed to the whole metallic circuit.

Next (Step J), strip 19 is folded into enclosure 52 so that header 38 forms one face of the enclosure and permits the making of external connections to the circuit (FIGURES 12 and 13). If advisable, because of circuit configuration, insulating paper may be used to prevent short circuiting of the system. Moreover, if desired, the circuit of the invention may be hermetically sealed or otherwise encapsulated in the enclosure.

The method and apparatus of the invention permit the components and the flexible strip to be held in the mold and fixture through the various steps of preparation (fluxing), soldering, lead trimming, and cleaning. This eliminates the stresses induced by any loads which might be imposed on the electrical components and/or the flexible, electrical circuit because of the removal of the combination from the mold at various steps of the manufacturing process. It is within the contemplation of the invention to move the curved, flexible mold to various fixtures assoiated with the baths or tools used in the preparation, soldering and trimming operations. It is also within the contemplation of the invention to install the curved, flexible mold in a single fixture and either to move the various baths and tools to the fixture or to move the fixture into position with respect to the various baths and tools.

As various changes could be made in the above described method and apparatus without departing from the scope of the invention, it is intended that all matter contained in the above description or shown in the accompanying drawings shall be interpreted as illustrative and not in a limiting sense.

The embodiments of the invention in which an exclusive property or privilege is claimed are defined as follows:

1. The method of making a flexible, printed electrical circuit which comprises:

bonding a metallic sheet onto a flexible base formed of a material such as a polyimide which is stable at temperatures of the order of 700° F.;

applying an etch resistant material to the metallic sheet in selected, desired areas;

etching the metallic sheet so that the portions not covered by the etch resistant material is removed, leaving a metallic circuit on the flexible base;

removing the etch resistant material;

making openings at certain selected points in the metallic circuit;

masking certain selected areas in the metallic circuit;

applying solder resistant material to the metallic circuit;

removing the mask from the certain selected areas;

placing the metallic circuit with the solder resistant material applied thereto in register on a rigid template and inserting leads of electrical components through at least some of the selected points of the metallic circuit and the template;

placing a mold having recesses therein to receive the electrical components over the electrical components, removing said template to expose the leads and affixing the flexible base to the mold;

mounting the mold with the flexible base and electrical components affixed thereto in a moveable fixture positioned over a molten solder bath with the lead ends of the electrical components projecting outwardly from the mold; and moving the moveable fixture so that the metallic circuit passes through the molten solder bath to thereby solder the electrical components to the metallic circuit.

2. The method of claim 1 wherein:

the mold is a flexible, curved mold having said recesses therein and is placed over the electrical components;

the flexible base is affixed to the flexible, curved mold; and the moveable fixture is rotatable and is rotated so that the metallic circuit passes through the molten solder bath.

3. The method of claim 2 wherein:

the temperature of the molten solder bath is of the order of 530° F. and the dwell time of the metallic circuit passing through the molten solder bath is of the order of less than one second.

4. The method of making a flexible, printed electrical circuit which comprises:

applying solder resistant material to selected portions of a metallic circuit which is bonded to a flexible base which is stable at high temperatures;

placing the metallic circuit with the solder resistant material applied thereto in register on a rigid template and inserting leads of electrical components therethrough at selected points of the metallic circuit and the template;

placing a mold having recesses therein to receive the electrical components over the electrical components, removing said template to expose the leads and affixing the flexible base to the mold;

mounting the mold with the flexible base and electrical components affixed thereto in a fixture positioned over a molten solder bath with the lead ends of the electrical components projecting outwardly from the mold; and moving the moveable fixture so that the metallic circuit passes through the molten solder bath to thereby solder the electrical components to the metallic circuit.

5. The method of claim 4 wherein:

the mold is a flexible, curved mold having said recesses therein and is placed over the electrical components;

the flexible base is affixed to the flexible, curved mold; and the moveable fixture is rotatable and is rotated so that the metallic circuit passes through the molten solder bath.

6. The method of claim 5 wherein:

the temperature of the molten solder bath is of the order of 530° F. and the dwell time of the metallic circuit passing through the molten solder bath is of the order of less than one second.

7. The method of claim 5 wherein one of the electrical components is a header and which includes:

removing the flexible base from the rotatable fixture and the flexible, curved mold;

cleaning the metallic circuit with the electrical components affixed thereto; and folding the metallic circuit with the electrical components affixed thereto into an enclosure such that connection may be made to the header from outside the enclosure.

8. Apparatus for passing a flexible, electrical printed circuit with electrical components inserted therein through a molten solder bath to solder the electrical components to the electrical printed circuit comprising:

a rotatable fixture mounted above the molten solder bath;

mounting means for mounting the flexible, electrical circuit with electrical components inserted therein on the rotatable fixture such that the lead ends of the electrical components pass through the molten solder bath as the rotatable fixture is rotated;

the mounting means including a flexible mold having an arcuate surface for supporting the flexible circuit such that the circuit is supported in an arcuate configuration and said surface being interrupted by recesses therein shaped to receive the electrical components and having means to affix the flexible, electrical printed circuit thereto; and the flexible, arcuate mold being removable and insertable with respect to the rotatable fixture.

References Cited

UNITED STATES PATENTS

| | | | |
|---|---|---|---|
| 2,740,193 | 4/1956 | Pessel | 29—626 |
| 2,777,193 | 1/1957 | Albright et al. | 29—626 |
| 3,052,957 | 9/1962 | Swanson | 29—626 |
| 3,059,604 | 10/1962 | Brandys | 29—503 XR |
| 3,395,439 | 8/1968 | Palesi et al. | |
| 2,962,801 | 12/1960 | Cass | 29—626 |

FOREIGN PATENTS 617,126 Canada.

OTHER REFERENCES

Electronics, vol. 38, No. 6—page 168, published Mar. 22, 1965, by Dupont Inc. Copy in 174–68.5.

JOHN F. CAMPBELL, Primary Examiner

ROBERT W. CHURCH, Assistant Examiner

U.S. Cl. X.R.

29—203, 503, 573; 118—500, 503; 174—68.5; 228—36, 37, 38, 44; 269—55, 56; 317—101; 339—17